(12) United States Patent
Kalosha et al.

(10) Patent No.: US 8,396,091 B2
(45) Date of Patent: Mar. 12, 2013

(54) DEVICE COMPRISING A LASER

(75) Inventors: Vladimir Kalosha, Berlin (DE);
Kristijan Posilovic, Berlin (DE); Dieter Bimberg, Berlin (DE)

(73) Assignee: Technische Universitat Berlin, Berlin (DE)

( * ) Notice: Subject to any disclaimer, the term of this patent is extended or adjusted under 35 U.S.C. 154(b) by 20 days.

(21) Appl. No.: 13/018,020

(22) Filed: Jan. 31, 2011

(65) Prior Publication Data

US 2012/0195335 A1 Aug. 2, 2012

(51) Int. Cl.
*H01S 5/00* (2006.01)

(52) U.S. Cl. ............ 372/43.01; 372/50.11; 372/64; 372/102

(58) Field of Classification Search ......... 372/43.01, 372/50.11, 64
See application file for complete search history.

(56) References Cited

U.S. PATENT DOCUMENTS

| 4,805,183 | A * | 2/1989 | Kudo et al. ............ 372/96 |
| 6,810,054 | B2 | 10/2004 | Sousa et al. |
| 2004/0120377 | A1 | 6/2004 | Marsh et al. |
| 2007/0133648 | A1 | 6/2007 | Matsuda et al. |
| 2007/0223549 | A1 | 9/2007 | Livshits et al. |
| 2007/0248134 | A1 | 10/2007 | Hatori et al. |
| 2008/0253421 | A1 | 10/2008 | Charache et al. |

FOREIGN PATENT DOCUMENTS

JP 6-112570 4/1994

OTHER PUBLICATIONS

Ackley, D. et al. "Phase-Locked Injection Laser Arrays with Variable Stripe Spacing" IEEE Journal of Quantum Electronics, Dec. 1986, vol. QE-22, No. 12, pp. 2204-2212.

Botez, D. "High-power monolithic phase-locked arrays of antiguided semiconductor diode lasers", IEEE Proceedings-J, Feb. 1992, vol. 139, No. 1, pp. 14-23.

Botez, D. et al.—Diode Laser Arrays, Cambridge: Cambridge University Press (1994).

Botez, D. et al. "Watt-range, coherent, uniphase powers from phase-locked arrays of antiguided diode lasers" Applied Physics Letters, May 13, 1991, vol. 58, No. 19, pp. 2070-2072.

Butler, J. et al. "Coupled-mode analysis of phase-locked injection laser arrays" Applied Physics Letters, Feb. 1, 1984, vol. 44, No. 3, pp. 293-295.

Chuang, S. L.—Physics of Optoelectronic Devices, New York: Wiley & Sons (1995).

Crump, P. et al. "975 nm high powerdiode lasers with high efficiency and narrow vertical far field enabled by low index quantum barriers", Applied Physics Letters, 2010, vol. 96, pp. 131110-1 to 131110-3.

Kapon, E. "The Supermode Structure of Phase-Locked Diode Laser Arrays with Variable Channel Spacing" IEEE Journal of Quantum Electronics, Jan. 1987, vol. QE-23, No. 1, pp. 89-93.

Kim, K. et al. "High power single-lateral-mode operation of InAs quantum dot based ridge type laser diodes by utilizing a double bend waveguide structure", Applied Physics Letters, 2010, vol. 96, pp. 261106-1 to 261106-3.

Masanotti, D. et al. "Optical Guiding Properties of High-Brightness Parabolic Bow-Tie Laser Arrays", IEEE Journal of Quantum Electronics, Jul. 2005, vol. 41, No. 7, pp. 909-916.

(Continued)

*Primary Examiner* — Dung Nguyen
(74) *Attorney, Agent, or Firm* — Foley & Lardner LLP

(57) ABSTRACT

An embodiment of the invention relates to a device comprising a laser and a waveguide stripe or netlike hexagonal stripe structure, which allows propagation of multitude of the lateral modes in the waveguide stripe or stripe structure, wherein the waveguide stripe has at least one corrugated edge section along its longitudinal axis to provide preferable amplification of the fundamental lateral mode or in-phase supermode and to obtain high brightness of the emitted radiation.

13 Claims, 14 Drawing Sheets

OTHER PUBLICATIONS

Maximov, M. et al "High-Performance 640-nm-Range GaInP-AlGaInP Lasers Based on the Longitudinal Photonic Bandgap Crystal With Narrow Vertical Beam Divergence" IEEE Journal of Quantum Electronics, Nov. 2005, vol. 41, No. 11, pp. 1341-1348.

Paschke, K. et al., "Nearly Diffraction Limited 980-nm Tapered Diode Lasers With an Output Power of 7.7 W", IEEE Journal of Selected Topics in Quantum Electronics, Sep./Oct. 2005, vol. 11, No. 5, pp. 1223-1227.

Scifres, D. et al. "Leaky wave room-temperature double heterostructure GaAs:GaAlAs diode laser", Applied Physics Letters, Jul. 1, 1976, vol. 29, No. 1, pp. 23-25.

Streifer, W. et al. "Substrate Radiation Losses in GaAs Heterostructure Lasers" IEEE Journal of Quantum Electronics, Mar. 1976, vol. QE-12, No. 3, pp. 177-182.

Suemune, I. et al. "Mode Characteristics of the Multiple-Stripe Laser Effects of the Loss Embedded in the Outer Unpumped Region", Journal of Lightwave Technology, Jul. 1986, vol. LT-4, No. 7, pp. 730-738.

Partial Search Report PCT/EP2012/050746 dated Jul. 3, 2012.

R. Millett et al., "The impact of laterally coupled grating microstructure on effective coupling coefficients", Nanotechnology, 21 (2010) 134015, 6 pgs.

International Search Report and Written Opinion issued in related International Patent Application No. PCT/EP2012/050746, dated Sep. 7, 2012.

* cited by examiner

DEVICE COMPRISING A LASER

The present invention relates to a semiconductor lasers, and more particularly to high-brightness edge-emitting semiconductor laser diodes or diode arrays. For instance, the invention refers to diodes or diode arrays which emit high power with narrow divergence of the laser beam in the lateral direction.

BACKGROUND OF THE INVENTION

High-brightness edge-emitting semiconductor lasers are lasers that are characterized by high power and high beam quality of the output radiation. These semiconductor optical sources are attractive for use in a variety of applications including, for example, industrial material processing, pumping of fiber amplifiers, fiber and solid state lasers, free space communications, second harmonic generation, medicine, laser printing, lidar. The emission of high-brightness lasers shows conveniently an approximately constant spot size over significant propagation distances (far-field zone) and is suitable for a variety of direct applications, without using external focusing optical systems of large complexity.

High-brightness lasers are supposed to radiate high power and simultaneously have small spatial angle (small divergence) of the radiation in both vertical direction (direction of the epitaxial growth) and lateral direction (parallel to the epitaxial plane). The brightness of a laser source is generally understood as the power divided by the mode area in the focus and the spatial solid angle in the far-field. As compared to diffraction-limited beams, for non-diffraction-limited beams the brightness is reduced by the product of the M2 factors of the beam quality for the vertical and lateral direction. The M2 factor is defined as the product of beam radius at the beam waist and the far-field beam divergence angle divided by the corresponding product for a diffraction-limited Gaussian beam with the same wavelength.

Typical high-power edge-emitting lasers have a large divergence in the vertical direction and a low beam quality in the lateral direction. They consist typically of a vertical sub-um-sized single-mode epitaxial layer waveguide of III-IV or II-VI semiconductor materials and a multi-mode laterally etched waveguide of a width of several tens of um. This results in the M2 beam quality factor in the lateral direction which is typically much higher than in the vertical direction due to the emission of a multitude of higher order modes. Such a radiation cannot be focused to a small spot, needed for most applications, even using complicated external focusing optical systems.

A number of different approaches are known to obtain high-power semiconductor lasers with small divergence in the vertical direction. A concept of large optical cavity with low index-contrast GaAs/AlGaAs waveguide in the vertical direction was developed which resulted in ~1 W single-mode power and a vertical beam divergence of ~10° (see Ref. [1] and references therein). Another concept of high-brightness semiconductor lasers employs a thick vertical waveguide formed by a quasi-periodic multi-layered GaAs/AlGaAs sequence known as a vertical photonic bandgap crystal (PBC lasers) [2]. This approach has allowed generating a narrow vertical beam divergence down to 5° or less at different wavelength ranges from the visible to the near-infrared. A single mode cw output power of 2.1 W at 980 nm, and as a result, highest brightness to date for conventional semiconductor lasers of 0.35 GW/cm$^2$sr was reported. The PBC laser approach is applicable also to other laser diode material systems e.g. based on (Al,Ga,In)N/GaN semiconductor materials, generating light in the UV-green range. An alternative concept is based on a leaky-wave laser design providing output of the laser emission through a thick transparent substrate with extremely narrow beam divergence of <1° [3-4]. However, development of this concept has been restrained by the existence, besides of such a low divergence substrate beam, also of large divergence beam coming from a conventional narrow vertical waveguide including the gain medium. The latter typically contains a considerable fraction of the output power and no high output power of the leaky-wave lasers in the substrate mode was reported yet.

The output power of edge-emitting semiconductor lasers and output beam quality in the lateral direction are defined by the lateral laser structure which provides the optical field confinement in this direction and simultaneously supplies the pump current to the active area. Typically the lateral laser structure is comprised of an etched stripe characterized by different refractive indices in the stripe cross-section and coinciding with the current contact. With increasing stripe area, the pump current and hence the emitted laser power increase, as the power is approximately proportional to the current. The latter relation is valid up to the onset of thermally induced current-spreading and gain hole-burning nonlinear effects. Narrow single stripes provide a single-mode radiation with single-lobed far-field in the lateral direction but yield no high power, since no high enough currents are possible. Widening of the stripe allows to launch high current and increase the output power, however inevitably worsens the output beam quality due to lasing of higher-order lateral modes of a wide waveguide stripe characterized by multi-lobe far fields.

Several approaches are known to find a compromise between the power and the beam quality in the lateral direction for edge-emitting semiconductor lasers. A tapered stripe geometry presents an effective design to combine the desirable operational characteristics of high power and narrow output beam with simple, low cost device fabrication (see Ref. [5] and references therein). For tapered stripe waveguides, it is considered that the fundamental lateral mode corresponding to the narrow end of the taper have diffraction-free propagation and amplification along the whole extent of the stripe, including the wide end of the stripe. Higher-order lateral modes of the wide taper part are discriminated at the narrow end and make up only a small portion of the laser emission at the output facet. The output emission of the tapered laser consists mostly of the fundamental lateral mode which corresponds to the wide taper part near the output facet, showing a single-lobe far field. The output power can be rather large due to the large total contact area. Both these factors made tapered lasers to be a promising approach for development of high-brightness diode lasers. A modification of the tapered stripe lasers is also known, where the wide stripe of the diode laser has a narrow part in the middle leading to the shape of a "bow-tie" waveguide [6].

Similar mechanisms of fundamental lateral mode selection and higher-order modes discrimination are utilized in double bend stripe waveguides [7]. For relatively wide stripes at the rear and output facet, the fundamental lateral mode provides a much smaller loss at the stripe bends than the higher-order lateral modes. As a result, the output emission has a single-lobe far field in the lateral direction with potentially higher power due to the stripe, which could be made wider as compared to straight stripes providing a comparable output beam quality.

Attempts to increase the brightness of edge-emitting lasers were also made by using multi-stripe field-coupled laser arrays with a total power being nearly proportional to the single-stripe output power times the number of stripes [8-13].

The lateral far-field divergence of multi-stripes being defined by the total width of the device is narrower than that of a single stripe, leading to another way, which allows increasing the brightness. However, in praxis the field-coupled multiple stripes typically radiate at many lateral modes with multi-lobe far-field patterns, the number of modes being equal to the number of stripes, provided each stripe is laterally single-mode. These multiple modes (so called supermodes) have different phase relations between the electromagnetic fields emitted from each of the stripes considered as individual light sources. Only the mode with equal phase from all stripes (in-phase mode) or the mode with pi-shifted phases (out-of-phase mode) along the whole array cross-section are of interest for achieving a high brightness. The in-phase and out-of-phase supermodes have single- or double-lobe far fields, respectively, and are suitable for applications. A presence of other supermodes with different phase shifts deteriorates the output beam quality, since they show a multi-lobe far field. For coupled laser arrays, thus the challenge remains to achieve a high lateral beam quality, since the multiple supermodes of the arrays equally contribute to the output, because they are degenerated by confinement factors and losses.

Different types of field coupling between the stripes were considered in order to eliminate this degeneracy—evanescent-wave coupling, leaky-wave coupling, diffraction coupling, e.g. by means of external mirrors (see Ref [12] and references therein). It was done by different modifications of the stripe processing, resulting in different ratios of the refractive indices within stripes and inter-stripe areas. Another realization for the same purpose is known using arrays with coupling the stripes by means of Y-shaped junctions or combination of X- and Y-shaped junctions [12]. Non-uniform stripe arrays in the lateral direction were also proposed [13] to eliminate the lateral mode degeneration. In contrast to these realizations of stripe arrays with the near-order coupling between neighboring stripes, Talbot-type spatial filters were employed with far-order field coupling of the stripes [14].

However, for all these laser diode arrays the discrimination of multiple lateral modes in favor of the desired single mode remains weak and/or too sensitive to the variations of the laser operational conditions (as in the case of diffraction coupling and Talbot filter). Differences obtained in the confinement factors and losses of the in-phase or out-of-phase mode (as well as any preferable single lateral mode) as compared to other lateral modes are too small.

OBJECTIVE OF THE PRESENT INVENTION

An objective of the present invention is to provide a device, which provides radiation with small divergence in lateral direction in the fundamental mode.

BRIEF SUMMARY OF THE INVENTION

An embodiment of the invention relates to a device comprising a laser, and a waveguide stripe, the width of which allowing a multimode propagation of radiation along the longitudinal axis of the waveguide stripe, wherein the waveguide stripe has at least one corrugated edge section along its longitudinal axis.

According to a preferred embodiment, the laser is an edge-emitting semiconductor laser diode. The waveguide stripe may be coupled to or may be part of the active region of the edge-emitting semiconductor laser diode.

Preferably, the waveguide stripe is arranged between a high-reflection rear facet and a low-reflection output facet of the edge-emitting semiconductor laser diode.

The waveguide stripe may comprise triangular-shape corrugations with the orientation of the wider triangular side towards the laser's output facet. Additionally, or alternatively, the wider triangular side may be oriented towards the laser's rear facet.

The triangular-shape corrugations may be symmetric or asymmetric with respect to the longitudinal axis.

The waveguide stripe may also comprise rectangular-shape corrugations which are inclined towards the output facet direction and symmetrical with respect to the longitudinal axis. Alternatively, the rectangular-shape corrugations may be inclined towards the output facet direction and asymmetrical with respect to the longitudinal axis.

Preferably, the corrugations are configured to provide additional radiation losses of higher-order lateral modes compared to the fundamental lateral mode by scattering radiation into the lateral directions. The losses provide that the output radiation is single-mode and that the far field has a single-lobe with small divergence.

The diode laser preferably comprises at least one heterostructure consisting of III-IV or II-VI semiconductor material, e.g. AlGaAs/GaAs, InGaAs/GaAs, InGaAsP/GaAs, ZnMgSSe/ZnSSe, (Al,Ga,In)N/GaN, said heterostructure forming a quantum well, quantum dot or quantum cascade laser.

A further embodiment of the invention relates to an edge-emitting semiconductor laser having a high-reflection rear facet and a low-reflection output facet wherein a netlike waveguide structure is arranged between the rear facet and the low-reflection output facet.

The netlike waveguide structure may be a hexagonal structure having hexagonal openings. Alternatively, the netlike waveguide structure may have round openings.

The netlike waveguide structure preferably comprises openings having a lower refractive index than the netlike waveguide structure.

The netlike waveguide structure may be configured to provide amplification of the in-phase mode and higher loss of the out-of-phase mode as well as all other supermodes of the netlike waveguide structure.

A further embodiment of the invention relates to a method of fabricating a device comprising an edge-emitting semiconductor laser diode, wherein a waveguide stripe, which has at least one corrugated edge section along its longitudinal axis, or a netlike waveguide structure is fabricated between a high-reflection rear facet and a low-reflection output facet of the edge-emitting semiconductor laser diode using one or more steps of photolithography and etching.

In summary, embodiments of the present invention provide high lateral beam quality for high-brightness edge-emitting semiconductor lasers. This is preferably achieved by employing a longitudinal inhomogeneity of the stripes and/or a lateral coupling of the stripes, which provides high losses for higher-order lateral modes and preferable guiding of in-phase supermodes, respectively. This mode discrimination may be obtained by means of a corrugated shape of the stripe and/or by means of a far-order field coupling in an array with a netlike stripe structure. Standard processing technology allows forming the corrugated boundaries of the stripes with characteristic sizes of the corrugations of the order of several wavelengths which are sufficient to provide a substantial discrimination. The method is applicable to different quantum well, quantum dot and quantum cascade semiconductor lasers generating in the ranges from the ultra-violet to the far-infrared.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout. It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

Figure 1:
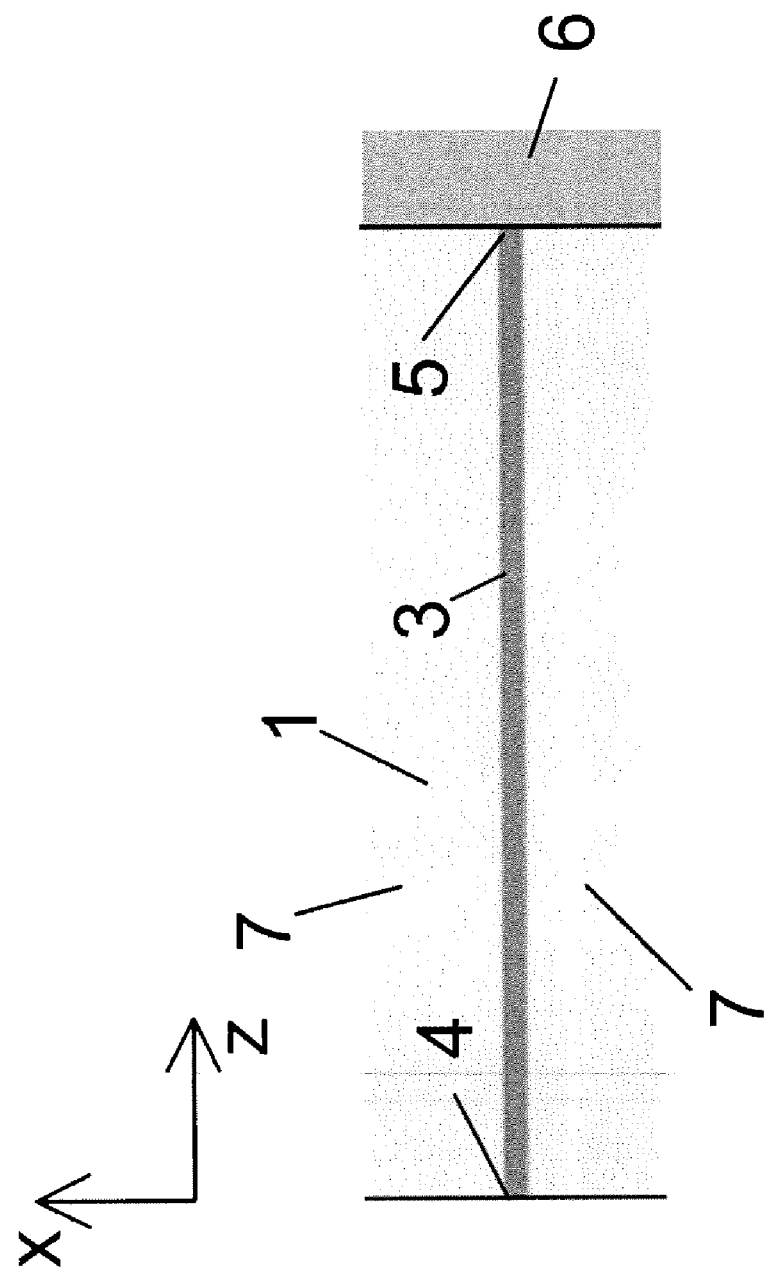
FIGS. 1-2 show prior art devices.

FIG. 1 shows a top view of a typical prior art single-stripe semiconductor laser 1. The lateral and longitudinal directions are designated by reference numerals x and z, respectively. The laser 1 inter alia comprises a wave guiding stripe 3, a rear facet 4, and an output facet 5. The free space outside the laser is designated by reference numeral 6. The refractive index of the stripe 3 is larger than the refractive index of the outer areas 7 in order to provide wave guiding in the lateral direction. The output and the rear facets have high reflective and low reflective coatings, respectively, consisting of several layers (not shown) of low refractive index materials with definite thicknesses.

Figure 2:
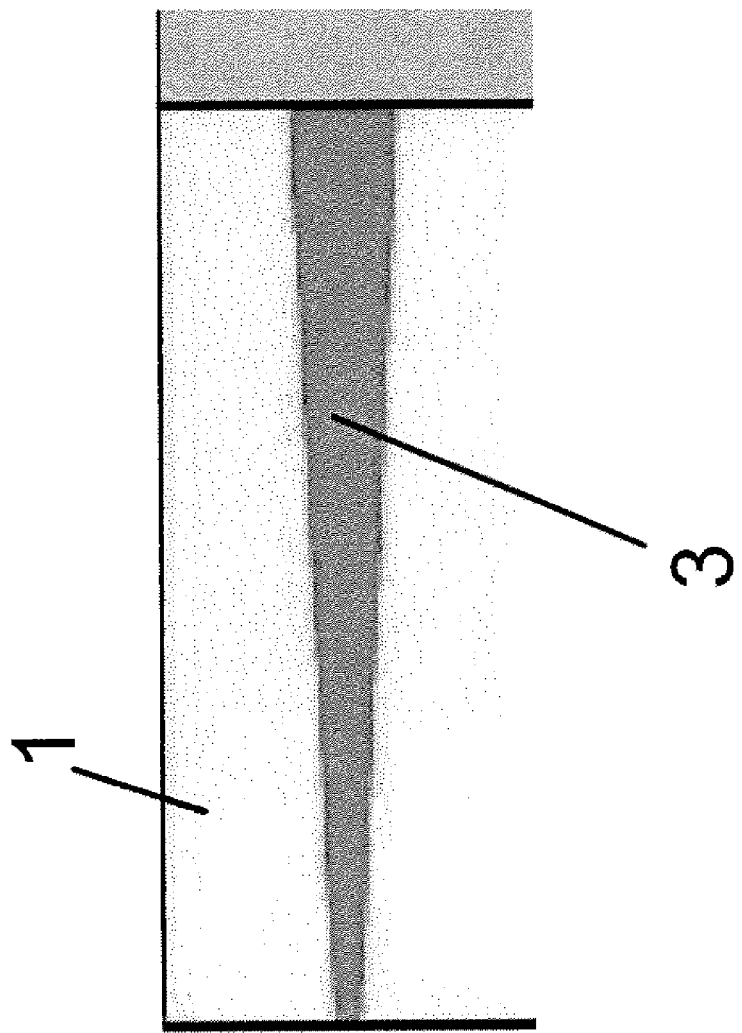
Figure 14:
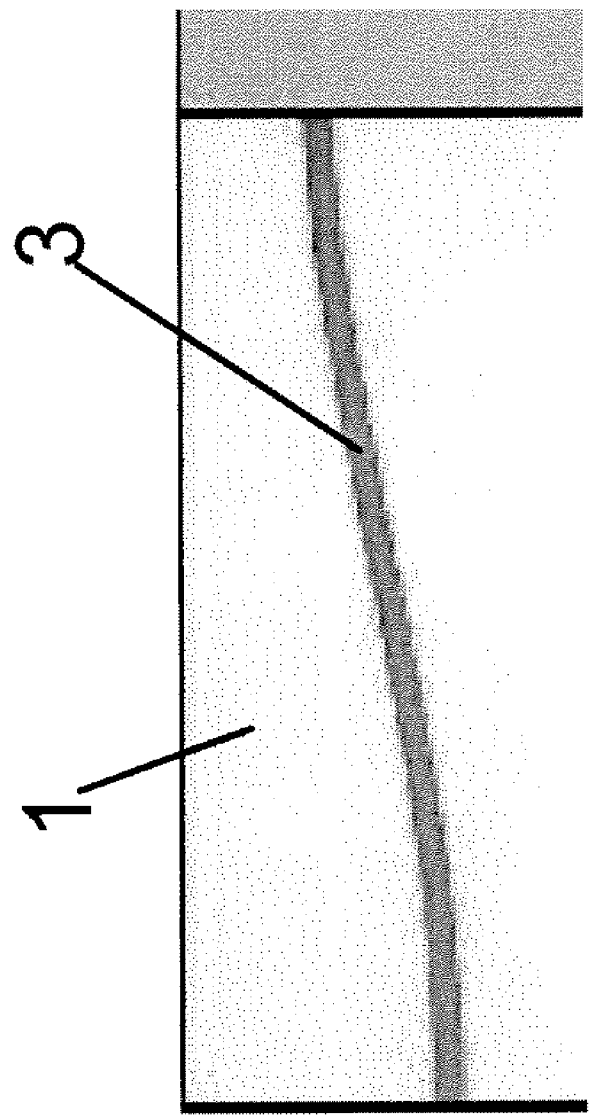
FIG. 14 shows a top view of a single-stripe semiconductor laser with a double bended stripe.

For high-brightness lasers both high-power output and narrow divergence are advantageous. For the vertical direction the effective methods to achieve high brightness were disclosed [1-4]. For the lateral direction, tapered stripes, bend stripes (see FIGS. 2 and 14) and stripe arrays are known. However the problem of avoiding poor beam quality in the lateral direction and simultaneously obtaining high power remains unresolved.

In order to address these drawbacks, embodiments of the present invention are based on the suppression of higher-order lateral modes in favor of the fundamental mode in order to provide a single-lobe far field.

The devices according to FIGS. 3-10 comprise longitudinally corrugated stripes 3'. The width of the stripes 3' is wide enough to allow multimode propagation of radiation along the longitudinal direction. However, the corrugations of the waveguide stripes 3' in the longitudinal direction cause large losses for higher-order lateral modes by increased scattering as compared to the fundamental lateral mode. Thus the output radiation is single-mode (despite the large stripe width which would allow multimode propagation), and results in a single-lobe far field with narrow divergence in the lateral direction, which means high brightness.

Figure 3:
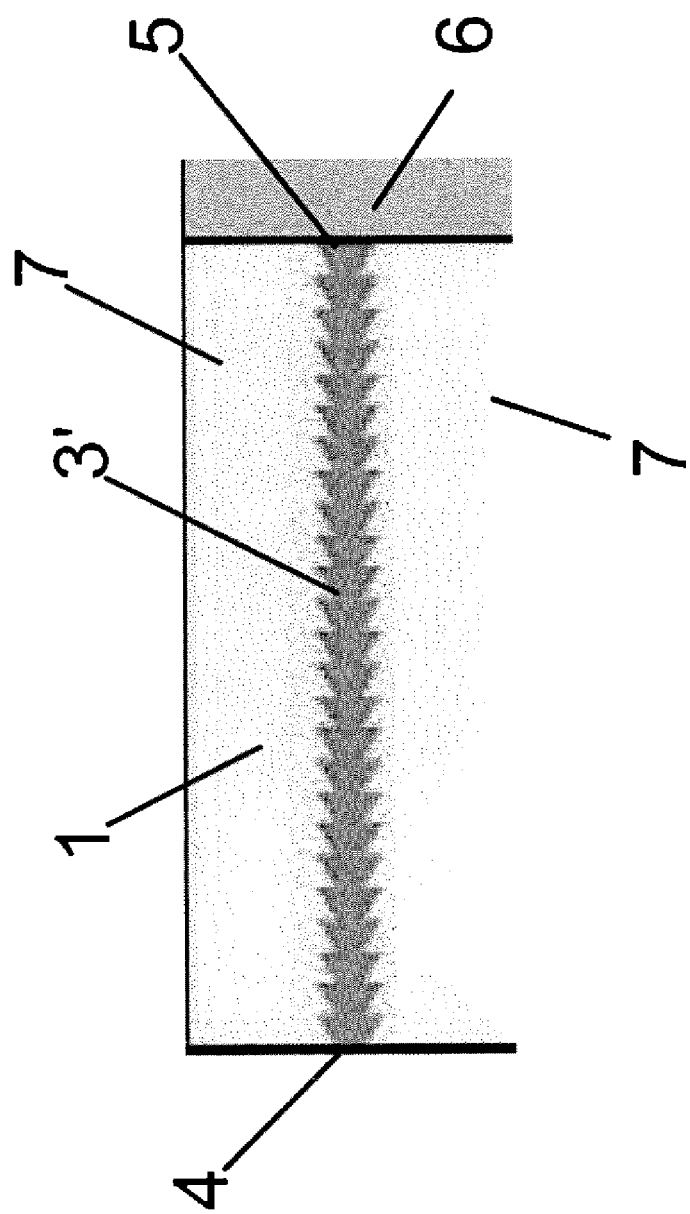
FIGS. 3-13 show various exemplary embodiments of devices according to the invention.

FIG. 3 shows a first exemplary embodiment of a device comprising a single-stripe semiconductor laser 1 in further detail. The laser 1 may be formed by a multi-layered heterostructure consisting of III-IV or II-VI semiconductor materials, e.g. AlGaAs/GaAs, InGaAs/GaAs, InGaAsP/GaAs, ZnMgSSe/ZnSSe, (Al,Ga,In)N/GaN. The structure including the layers with e.g. quantum wells provide wave guiding in the vertical direction and gain.

The laser 1 according to FIG. 3 comprises a longitudinally inhomogeneous waveguide stripe 3'. At both edges of the waveguide stripe 3', triangular-shape corrugations are provided with "saw-tooth" orientation with respect to the laser output facet 5. The refractive index of the stripe 3' is larger than the refractive index of the outer areas 7 in order to provide wave guiding in the lateral direction.

Both, wave guiding in the vertical and the lateral directions, as well as light amplification and laser output are performed in a well understood manner. In particular, the laser output occurs as a combination of the modes guided by the heterostructure with contributions from each mode defined by the mode confinement factor and loss.

The triangular-shape corrugations may be provided at both edges along the entire length of the waveguide stripe 3', as shown FIG. 3. Alternatively, only one edge may be provided with corrugations and/or only waveguide sections of the waveguide stripe 3' (i.e. not the entire stripe) may have corrugations.

Figure 4:
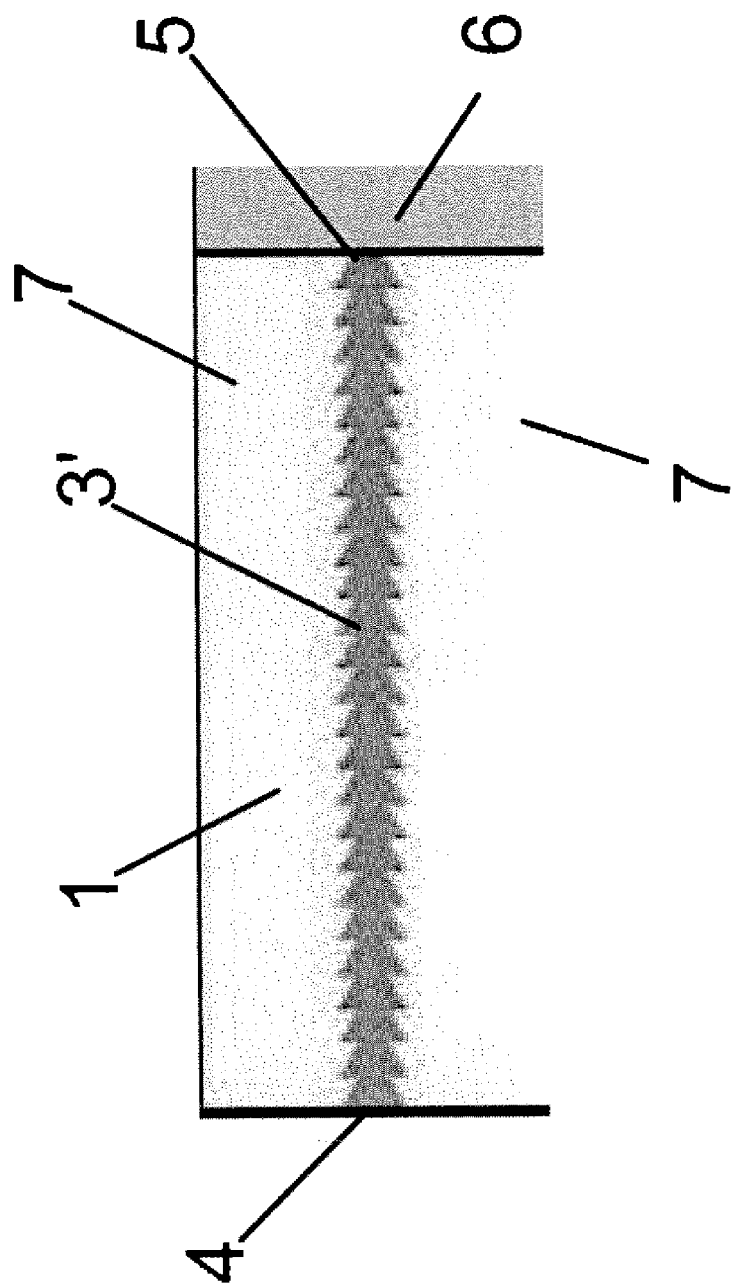

FIG. 4 shows a second exemplary embodiment of a device comprising a single-stripe semiconductor laser 1 in further detail. The laser 1 comprises a longitudinally inhomogeneous waveguide stripe 3' having triangular-shape corrugations with "saw-tooth" orientation with respect to the laser output facet 5. The "sawtooth" orientation in FIG. 4 is opposite to the orientation shown in FIG. 3.

Figure 5:
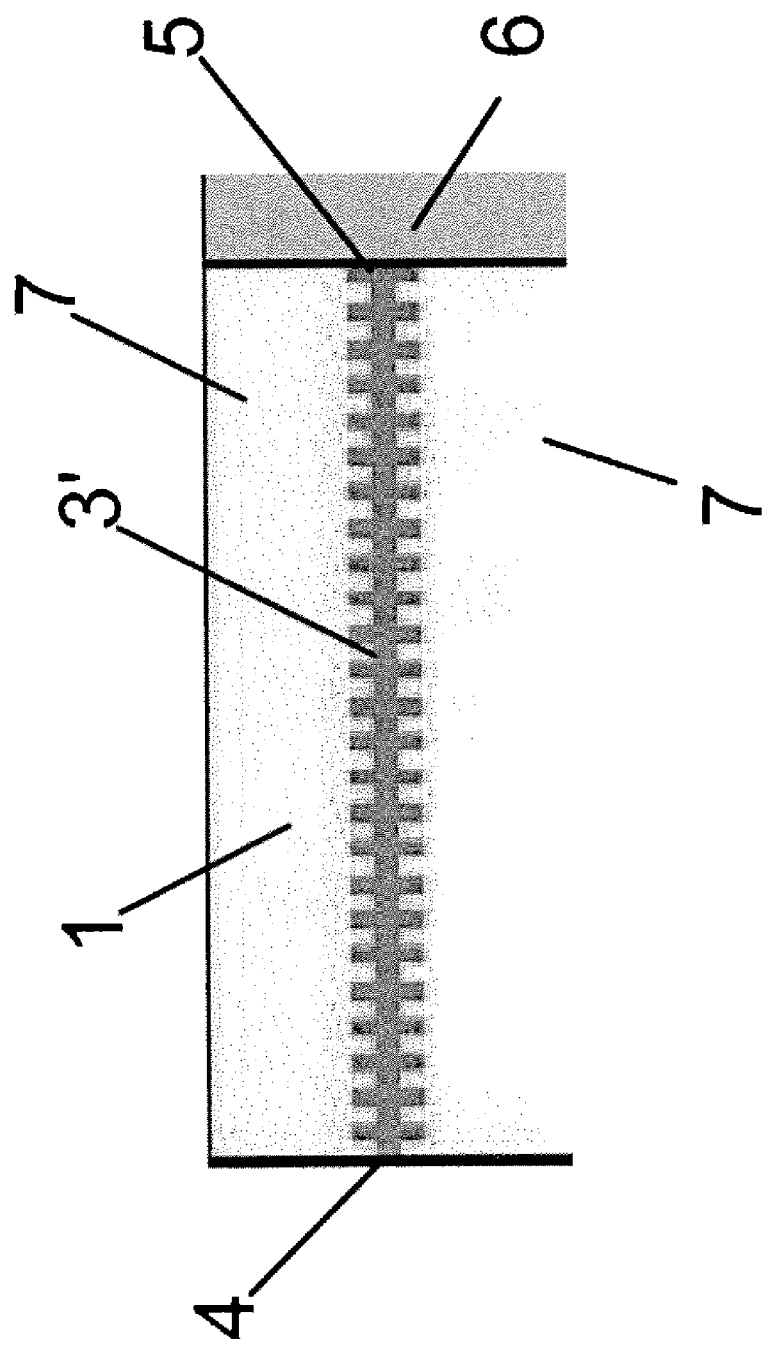

FIG. 5 shows a third exemplary embodiment of a device comprising a single-stripe semiconductor laser 1 in further detail. The laser 1 comprises a longitudinally inhomogeneous waveguide stripe 3' having rectangular-shape corrugations which are symmetric with respect to the lateral axis.

Figure 6:
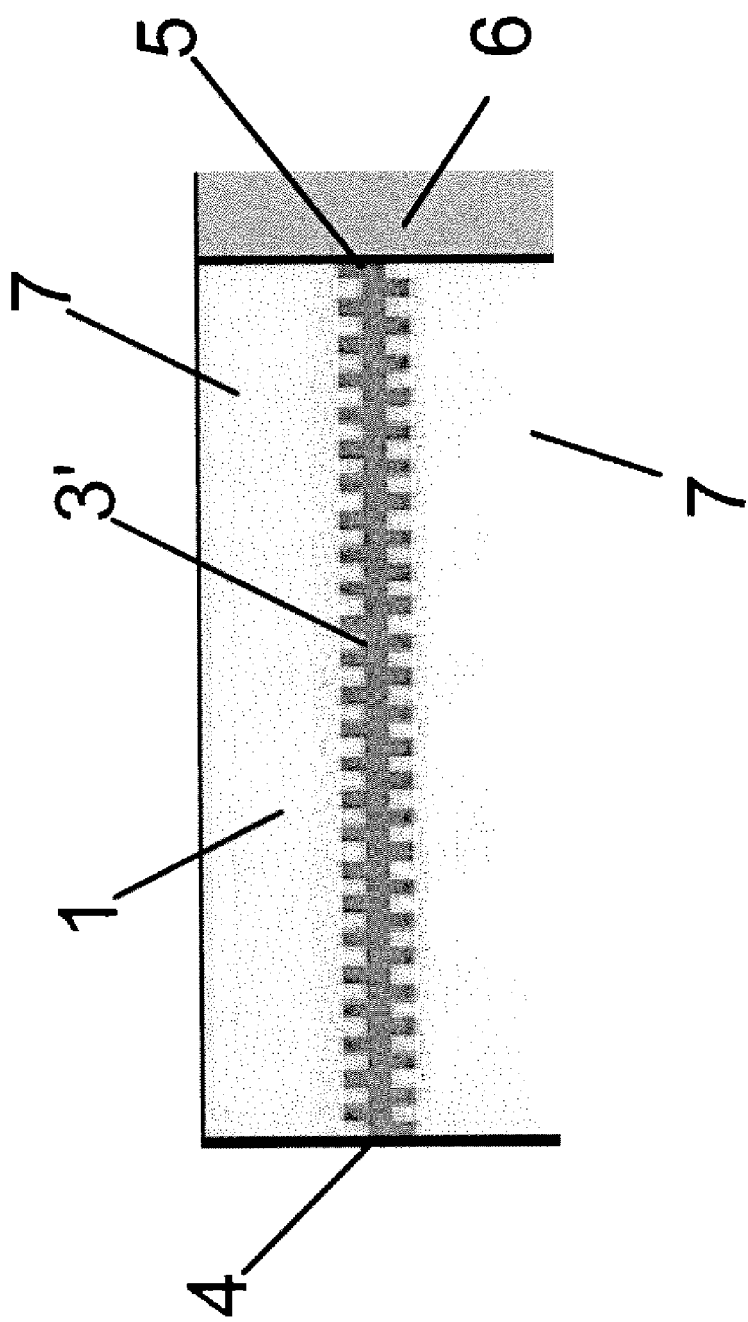

FIG. 6 shows a fourth exemplary embodiment of a device comprising a single-stripe semiconductor laser 1 in further detail. The laser 1 comprises a longitudinally inhomogeneous waveguide stripe 3' having rectangular-shape corrugations which are asymmetric with respect to the lateral axis.

Figure 7:
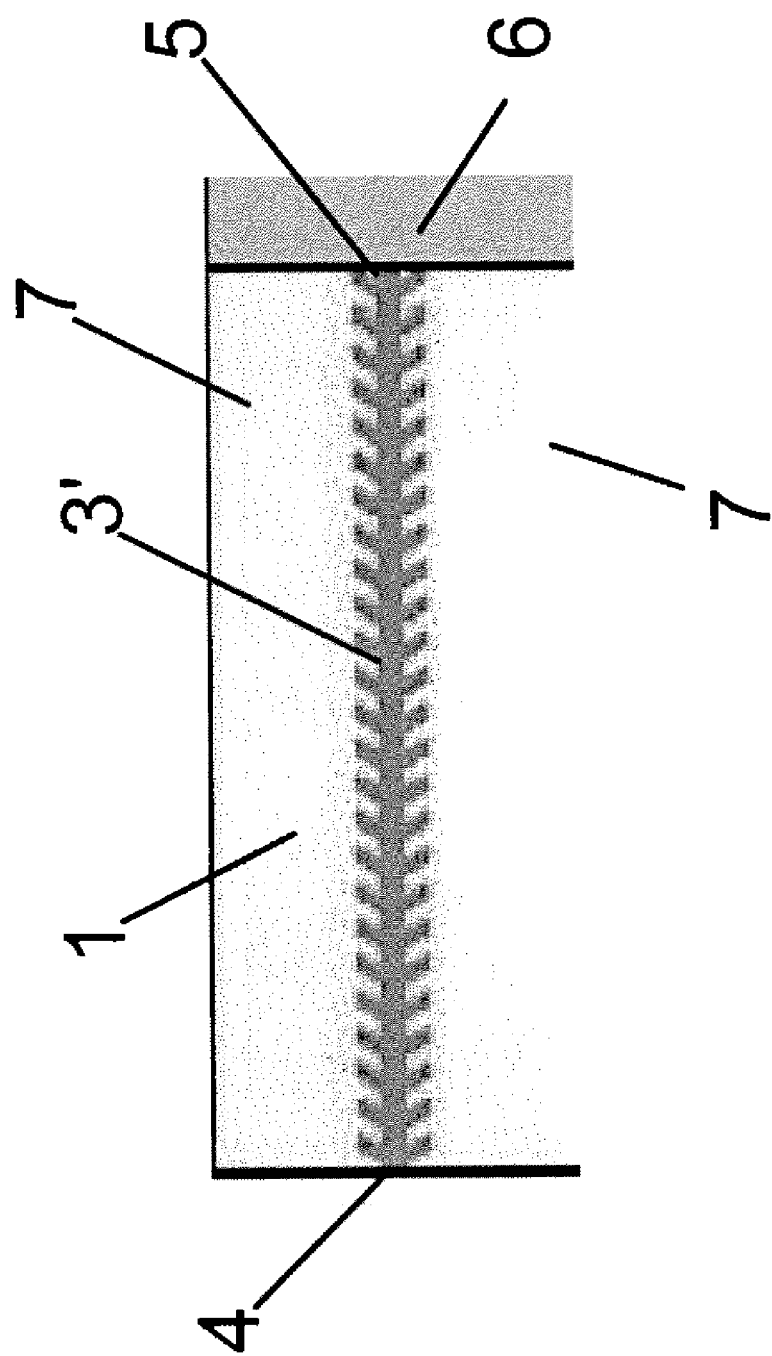

FIG. 7 shows a fifth exemplary embodiment of a device comprising a single-stripe semiconductor laser 1 in further detail. The laser 1 comprises a longitudinally inhomogeneous waveguide stripe 3' having inclined corrugations which are symmetric. At both sides of the lateral axis the corrugations are bent to the output facet direction with respect to the lateral axis.

Figure 8:
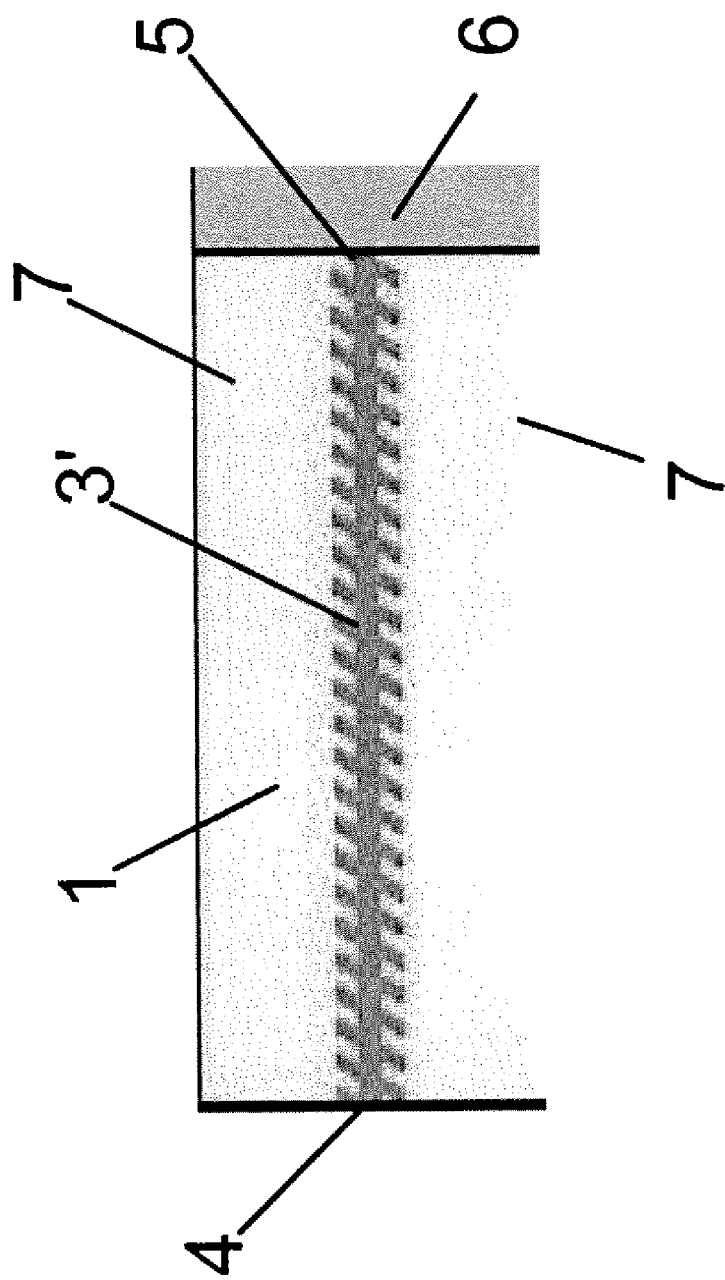

FIG. 8 shows a sixth exemplary embodiment of a device comprising a single-stripe semiconductor laser 1 in further detail. The laser 1 comprises a longitudinally inhomogeneous waveguide stripe 3' having inclined corrugations which are asymmetric. At both sides of the lateral axis, the corrugations are bent to opposite directions with respect to the lateral axis.

Figure 9:
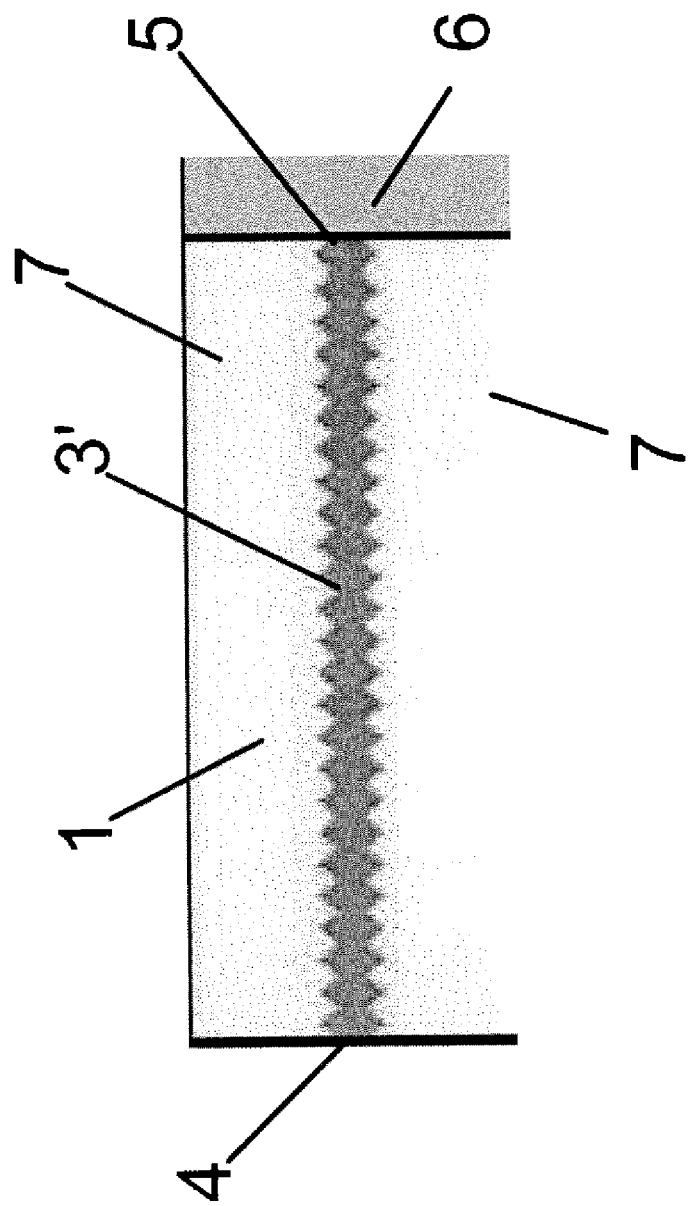

FIG. 9 shows a seventh exemplary embodiment of a device comprising a single-stripe semiconductor laser 1 in further detail. The laser 1 comprises a longitudinally inhomogeneous waveguide stripe 3' having triangular-shape corrugations which are symmetric in respect to the lateral axis.

Figure 10:
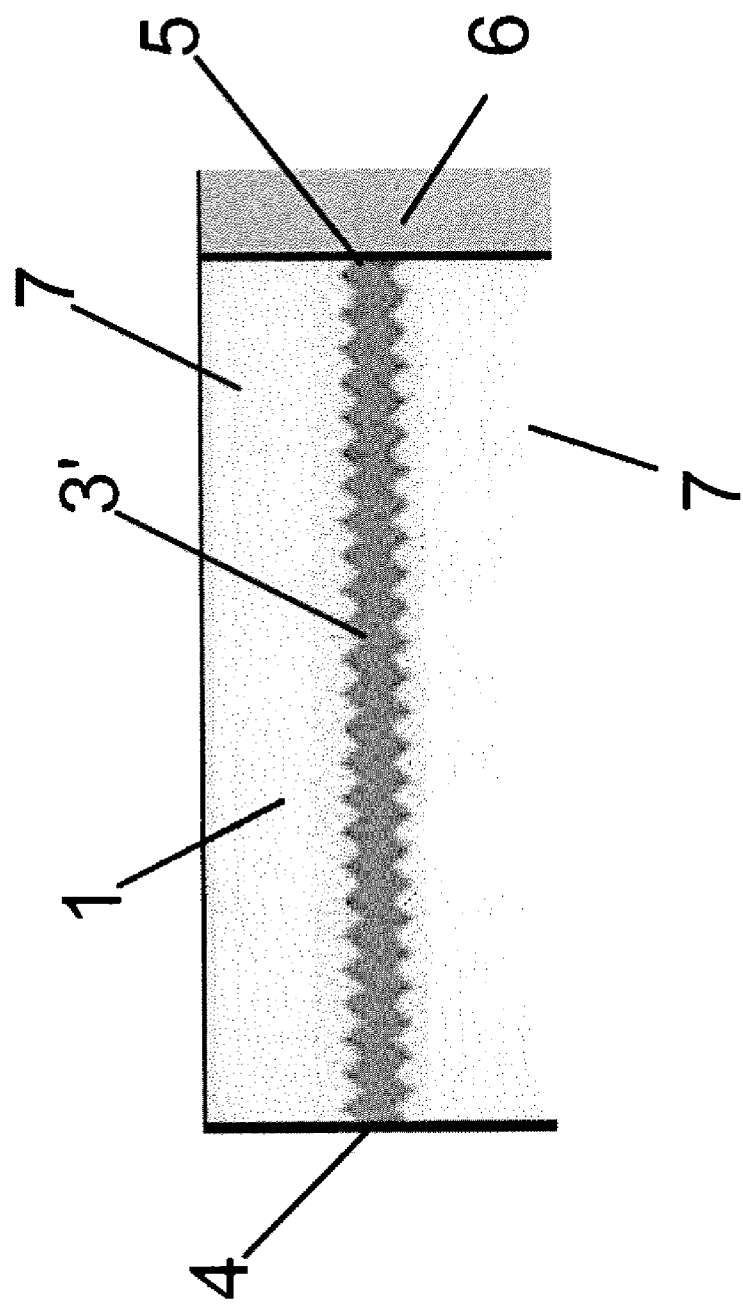

FIG. 10 shows an eighth exemplary embodiment of a device comprising a single-stripe semiconductor laser 1 in further detail. The laser 1 comprises a longitudinally inhomogeneous waveguide stripe 3' having triangular-shape corrugations which are asymmetric in respect to the lateral axis.

The effective discrimination of higher-order lateral modes in corrugated waveguides can be proven with the help of the two-dimensional wave equation [15]

$$(d^2/dx^2 + d^2/dz^2)E(x,z) = k^2 n^2(x,z) E(x,z) \quad (1)$$

solved numerically as a eigenvalue-eigenstate problem with respect to the wavenumber k and the lateral-longitudinal mode field E(x,z) for the refractive index and gain n(x,z) versus the lateral and longitudinal coordinates x and z, respectively.

Boundary conditions corresponding to non-reflecting boundaries at the top, bottom and right side (perfectly matched layers) and perfectly conducting boundary at the left side of the computation domain can be used. The complex eigenvalue k obtained defines the frequency and the loss (lifetime) of the modes E(x,z) which take into account field diffraction and radiation into the lateral direction for the refractive index profile including the contribution of the stripe corrugation. The rear and output facets typically consisting of several layers with definite thicknesses and refractive indices, providing high reflection and anti-reflection, respectively, can also be taken into account in the refractive index profile n(x,z) for the solution of Eq. (1).

In the one-dimensional case with n(z)=n our numerical solution of Eq. (1) gives the well-known longitudinal modes of a cavity formed by a finite-length slab. These modes consist of two counter-propagating plane waves in the cavity and an out-going plane wave in free space. Their wavenumbers satisfy the well-known laser generation condition [15]

$$R_1 R_2 \exp(2iknL)=1 \qquad (2)$$

where L is the cavity length, $R_1$=1 and $R_2$ are the refractive coefficients at the left rear and right output facets of the cavity, respectively.

The solution of Eq. (1) allows to find the two-dimensional counterpart of the laser condition (2), i.e. to find the complex wavenumbers k and the lateral-longitudinal profiles E(x,z) of the waveguide modes for a given distribution of the refractive index and gain n(x,z). By this way it allows to prove that higher-order lateral modes with multi-lobe far fields have larger loss than the fundamental mode for the corrugated stripes.

Figure 11:
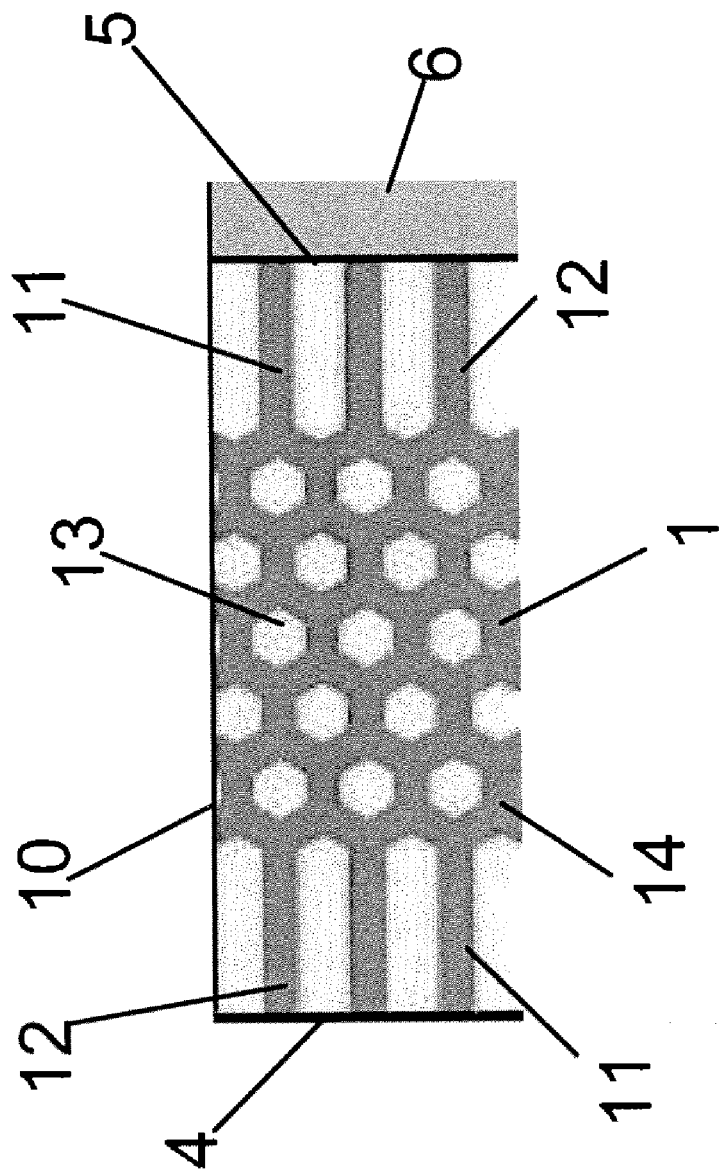
Figure 12:
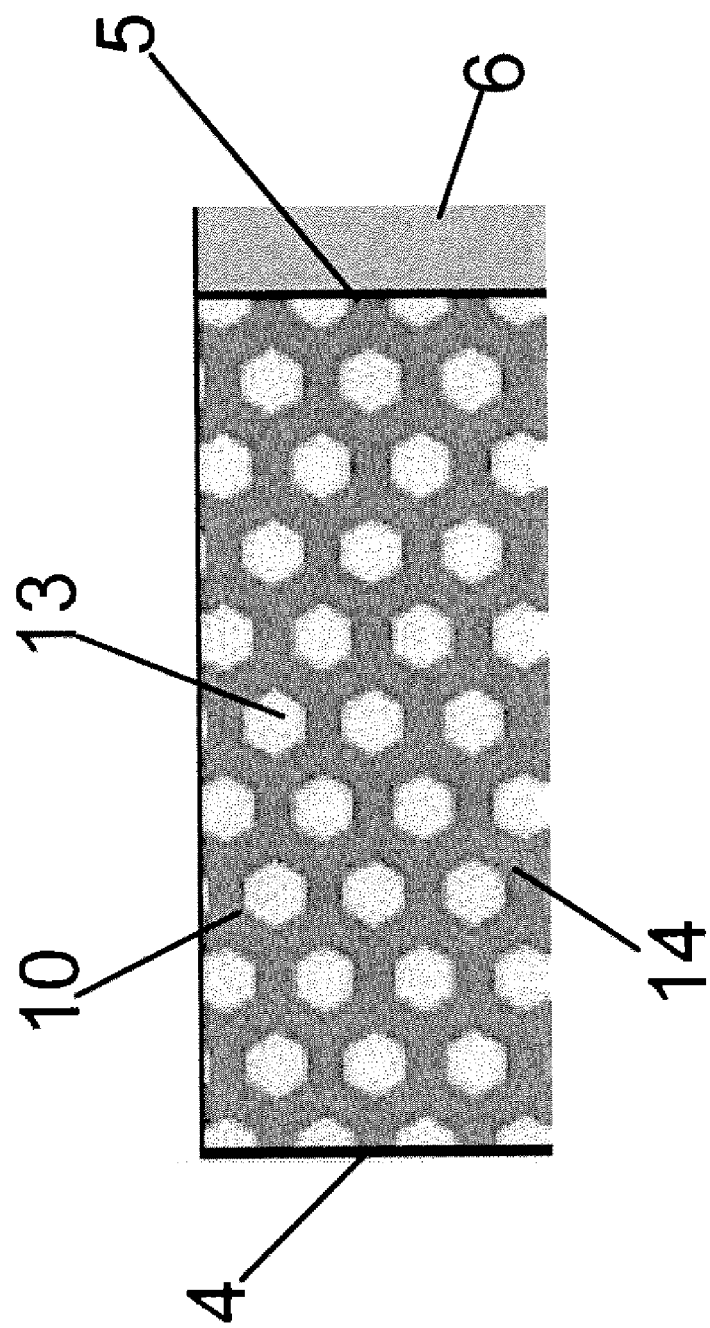
Figure 13:
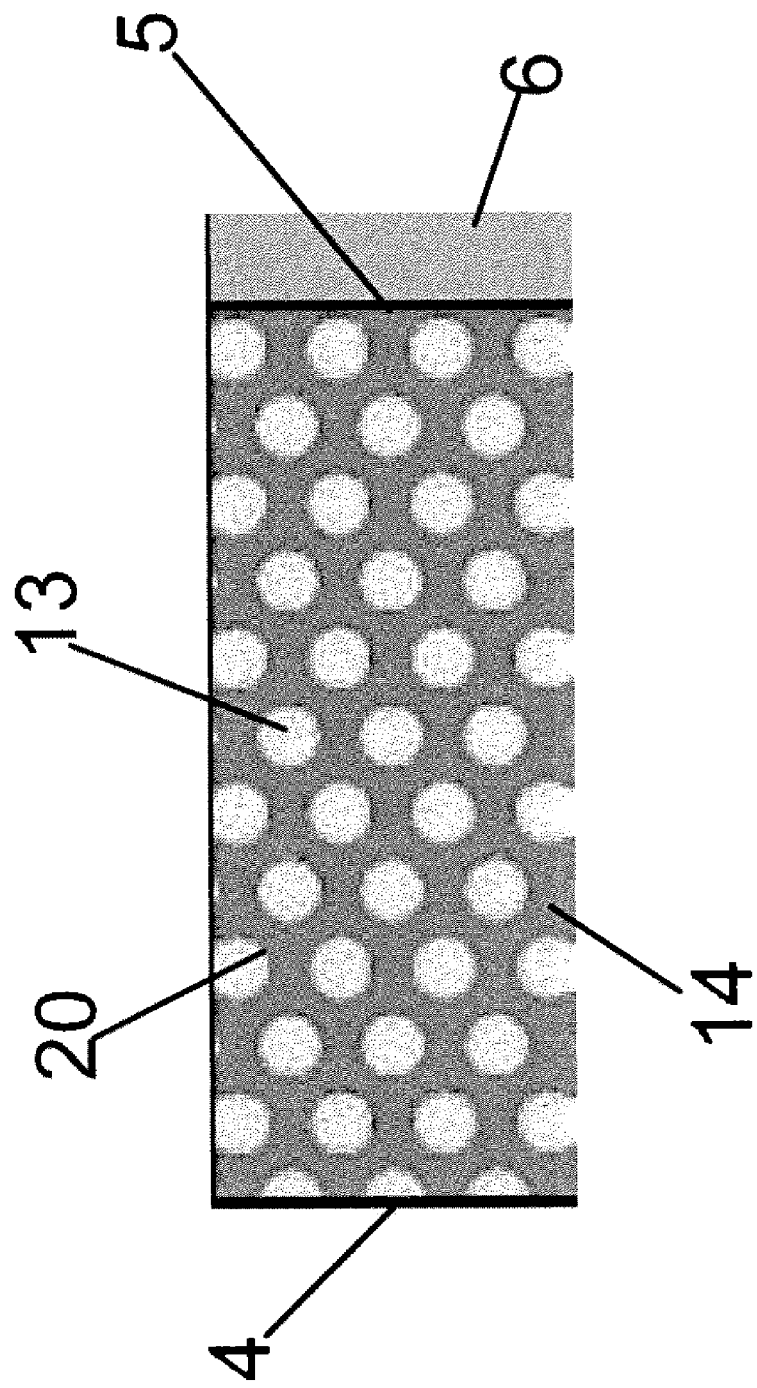

FIGS. 11-13 show further embodiments of devices having edge-emitting semiconductor lasers. The embodiments provide high power and low divergence in the lateral direction based on multi-stripe arrays with field-coupled multiple stripes. Far-order field coupling of the stripes provided by the waveguide structure, where each stripe couples with all the stripes in the same extent (not dominantly with the nearest neighbors) causes preferential guiding and amplification of the in-phase lateral supermode of the stripe array. The out-of-phase supermode of the stripe array has larger loss due to scattering at the stripe structure and contributes less to the output of the laser array. Radiation from multiple stripes is coherent and phase-locked, resulting in a single-lobe far field with small divergence in the lateral direction proportional to the number of the stripes.

The exemplary embodiment shown in FIG. 11 refers to a multiple-stripe semiconductor laser 1 with a netlike stripe structure 10. According to the embodiment of FIG. 11, the netlike stripe structure 10 is a hexagonal structure for field coupling of two arrays 11 each of which consists of three straight stripes 12. The number of the straight stripes 12 in the vicinity of the rear and output laser facet is not limited by three as shown and could be arbitrary. The hexagonal openings 13 of the netlike stripe structure 10 have a lower refractive index than the wave guiding stripes 14 of the netlike stripe structure 10.

The exemplary embodiment shown in FIG. 12 also comprises a hexagonal structure 10, but no arrays of straight stripes. The hexagonal structure 10 consists of, but is not limited to, three periods in the lateral direction as shown and could be arbitrary. The low-index openings 13 of the stripe structure 10 have a hexagonal shape.

The exemplary embodiment shown in FIG. 13 comprises a netlike stripe structure 20 with round openings 13. The embodiment may or may not comprise straight stripes 12 as shown in FIG. 11. The netlike structure 20 consists of, but is not limited to, three periods in the lateral direction as shown and could be arbitrary. The round openings 13 have a lower refractive index than the waveguide stripes 14 of the netlike stripe structure 20.

The embodiments shown in FIGS. 3-13 may consist of or comprise epitaxial layers of III-IV or II-VI semiconductor materials grown by metal organic vapor phase epitaxy (MOVPE) or molecular beam epitaxy (MBE). The single- or multi-stripe edge-emitting lasers may be manufactured by photolithography and ion-beam-assisted etching. This standard technology allows forming corrugated boundaries of the stripes with characteristic sizes of the corrugations of the order of several wavelengths which are sufficient to provide substantial discrimination of the higher-order lateral modes. The netlike stripe structures 10, and 20 as shown in FIGS. 11-13 may also be manufactured by photolithography and ion-beam-assisted etching.

In summary, embodiments of the invention relate to single-stripe edge-emitting semiconductor lasers with a stripe with corrugated boundary between areas with different refractive indices across the stripe to achieve lower lateral divergence of the output emission. The corrugations cause the discrimination of the lateral modes in wide stripes due to higher losses of the higher-order modes scattered into the lateral directions as compared to the fundamental lateral mode. The output emission of the stripe has high power and low divergence of the far field both due to wider stripe width as compared to a straight stripe.

Similarly, a high-brightness diode laser may be made of a multiple-stripe array with coupling of the stripes through a stripe structure having a hexagonal, a round or another shape. Multiple-stripe arrays provide far-order field coupling of all stripes, where in-phase lateral supermode of the stripe array have smaller losses in the lateral direction than out-of-phase supermode, as well as all other lateral modes of the stripe array. Thus, the far field has a single-lobe pattern corresponding to an in-phase mode with the divergence defined by the total output aperture of the array. The radiation from multiple stripes is coherent and phase-locked, resulting in a single-lobe far field with narrow divergence in the lateral direction, being inversely proportional to the number of the stripes.

REFERENCES

[1] P. Crump, A. Pietrzak, F. Bugge, H. Wenzel, G. Erbert, and G. Tränkle. "975 nm high power diode lasers with high efficiency and narrow vertical field enabled by low index quantum barriers," Appl. Phys. Lett., vol. 96, No. 131110 (2010).

[2] M. V. Maximov, Yu. M. Shernyakov, I. I. Novikov, S. M. Kuznetsov, L. Ya. Karachinsky, N. Yu. Gordeev, V. P. Kalosha, V. A. Shchukin, N. N. Ledentsov, "High performance 640 nm-range GaInP/AlGaInP lasers based on the longitudinal photonic bandgap crystal with narrow vertical beam divergence," IEEE J. Quantum Electron., Vol. 11, No. 11, pp. 1341-1348, (2005).

[3] W. Streifer, R. D. Burnham, D. R. Scifres, "Substrate radiation losses in GaAs heterostructure lasers," IEEE J. Quantum Electron., Vol. 12, No. 3, pp. 177-182 (1976).

[4] D. R. Scifres, W. Streifer, and R. D. Burnham, "Leaky wave room-temperature double heterostructure GaAs/GaAlAs diode laser," Appl. Phys. Lett., Vol. 29, No. 1, pp. 23-25 (1976).

[5] K. Paschke, B. Sumpf, F. Dittmar, G. Erbert, R. Staske, H. Wenzel, and G. Traenkle, "Nearly diffraction limited 980-nm tapered diode lasers with an output power of 7.7 W," IEEE J. Quantum Electron., Vol. 11, No. 5, pp. 1223-1227 (2005).

[6] D. Masanotti and F. Causa, "Optical guiding properties of high-brightness parabolic bow-tie laser arrays," IEEE J. Quantum Electron., Vol. 41, No. 7, pp. 909-916 (2005).

[7] K. C. Kim, I. K. Han, J. I. Lee, and T. G. Kim, "High power single-lateral-mode operation of InAs quantum dot based ridge type laser diodes by utilizing a double bend waveguide structure," Appl. Phys. Lett., Vol. 96, No. 261106 (2010).

[8] J. K. Butler, D. E. Ackley, and D. Botez, "Coupled-mode analysis of phase-locked injection laser arrays," Appl. Phys. Lett. Vol. 44, No. 2, pp. 293-295 (1983).

[9] I. Suemune, H. Fujii, and M. Yamanishi, "Mode characteristics of the multiple-stripe laser effects of the loss embedded in the outer unpumped region," J. Lightwave Techn. Vol. 4, No. 6, pp. 730-738 (1986).

[10] D. Ackley, J. Butler, and M. Ettenberg, "Phase-locked injection laser arrays with variable stripe spacing," IEEE J. Quantum Electron. Vol. 22, No. 12, pp. 2204-2212 (1986).

[11] D. Botez, M. Jansen, L. J. Mawst, G. Peterson, and T. J. Roth, "Wattrange, coherent, uniphase powers from phase-locked arrays of anti-guided diode lasers," Appl. Phys. Lett. Vol. 58, No. 5, pp. 2070-2072 (1991).

[12] Diode Laser Arrays, Eds.: D. Botez and D. R. Scifres. Cambridge: Cambridge University Press (1994).

[13] E. Kapon, "The supermode structure of phase-locked diode laser arrays with variable channel spacing," IEEE J. Quantum Electron. Vol. 23, No. 1, pp. 89-93 (1987).

[14] D. Botez, "High-power monolithic phase-locked arrays of antiguided semiconductor diode lasers," IEE Proc. Part J. Optoelectronics, Vol. 139, No. 1, pp. 14-23 (1992).

[15] S. L. Chuang, Physics of optoelectronic devices, New-York: Wiley & Sons (1995).

REFERENCE SIGNS 1 semiconductor laser
3 wave guiding stripe
3' wave guiding stripe
4 rear facet
5 output facet
6 free space
7 outer area
10 netlike stripe structure
11 array of straight stripes
12 straight stripe
13 openings
14 waveguide stripes
20 netlike stripe structure
x coordinate
z coordinate

The invention claimed is:

1. A device comprising:
a laser; and
a waveguide stripe, wherein a width of the waveguide stripe allows a multimode propagation of radiation along a longitudinal axis of the waveguide stripe,
wherein the waveguide stripe has at least one corrugated edge section along its longitudinal axis,
wherein the laser is an edge-emitting semiconductor laser diode and the waveguide stripe is coupled to or is part of an active region of the edge-emitting semiconductor laser diode,
wherein the waveguide stripe is arranged between a high-reflection rear facet and a low-reflection output facet of the edge-emitting semiconductor laser diode, and
wherein the waveguide stripe comprises triangular-shape corrugations with an orientation of a wider triangular side towards the output facet of the edge-emitting semiconductor laser diode.

2. The device according to claim 1, wherein said diode laser comprises at least one heterostructure having III-IV semiconductor material or II-VI semiconductor material, said heterostructure forming a quantum well, quantum dot or quantum cascade laser.

3. A device comprising:
a laser; and
a waveguide stripe, wherein a width of the waveguide stripe allows a multimode propagation of radiation along a longitudinal axis of the waveguide stripe,
wherein the waveguide stripe has at least one corrugated edge section along its longitudinal axis,
wherein the laser is an edge-emitting semiconductor laser diode and the waveguide stripe is coupled to or is part of an active region of the edge-emitting semiconductor laser diode,
wherein the waveguide stripe is arranged between a high-reflection rear facet and low-reflection output facet of the edge-emitting semiconductor laser diode, and
wherein the waveguide stripe comprises triangular-shape corrugations with an orientation of a wider triangular side towards the rear facet of the edge-emitting semiconductor laser diode.

4. A device comprising:
a laser; and
a waveguide stripe, wherein a width of the waveguide stripe allows a multimode propagation of radiation along a longitudinal axis of the waveguide stripe,
wherein the waveguide stripe has at least one corrugated edge section along its longitudinal axis,
wherein the laser is an edge-emitting semiconductor laser diode and the waveguide stripe is coupled to or is part of an active region of the edge-emitting semiconductor laser diode,
wherein the waveguide stripe is arranged between a high-reflection rear facet and a low-reflection output facet of the edge-emitting semiconductor laser diode, and
wherein the waveguide stripe comprises triangular-shape corrugations which are symmetric or asymmetric with respect to the longitudinal axis of the waveguide stripe.

5. A device comprising:
a laser; and
a waveguide stripe, wherein a width of the waveguide stripe allows a multimode propagation of radiation along a longitudinal axis of the waveguide stripe,
wherein the waveguide stripe has at least one corrugated edge section along its longitudinal axis,
wherein the laser is an edge-emitting semiconductor laser diode and the waveguide stripe is coupled to or is part of an active region of the edge-emitting semiconductor laser diode,
wherein the waveguide stripe is arranged between a high-reflection rear facet and a low-reflection output facet of the edge-emitting semiconductor laser diode, and
wherein the waveguide stripe comprises rectangular-shape corrugations which are inclined towards an output facet direction and symmetrical with respect to the longitudinal axis of the waveguide stripe.

6. A device comprising:

a laser; and a waveguide stripe, wherein a width of the waveguide stripe allows a multimode propagation of radiation along a longitudinal axis of the waveguide stripe, wherein the waveguide stripe has at least one corrugated edge section along its longitudinal axis, wherein the laser is an edge-emitting semiconductor laser diode and the waveguide stripe is coupled to or is part of an active region of the edge-emitting semiconductor laser diode, wherein the waveguide stripe is arranged between a high-reflection rear facet and a low-reflection output facet of the edge-emitting semiconductor laser diode, and wherein the waveguide stripe comprises rectangular-shape corrugations which are inclined towards an output facet direction and asymmetrical with respect to the longitudinal axis of the waveguide stripe.

7. A device comprising:

a laser; and a waveguide stripe, wherein a width of the waveguide stripe allows a multimode propagation of radiation along a longitudinal axis of the waveguide stripe, wherein the waveguide stripe has at least one corrugated edge section along its longitudinal axis, wherein the laser is an edge-emitting semiconductor laser diode and the waveguide stripe is coupled to or is part of an active region of the edge-emitting semiconductor laser diode, wherein the waveguide stripe is arranged between a high-reflection rear facet and a low-reflection output facet of the edge-emitting semiconductor laser diode, wherein the waveguide stripe comprises corrugations that are configured to provide additional radiation losses of higher-order lateral modes compared to a fundamental lateral mode by scattering radiation into lateral directions, said losses providing that the output radiation is single-mode and that a far field has a single-lobe with small divergence.

8. A device comprising:

an edge-emitting semiconductor laser having a high-reflection rear facet and a low-reflection output facet, wherein a netlike waveguide structure is arranged between the high-reflection rear facet and the low-reflection output facet.

9. The device according to claim 8, wherein the netlike waveguide structure is a hexagonal structure having hexagonal openings.

10. The device according to claim 8, wherein the netlike waveguide structure has round openings.

11. The device according to claim 8, wherein the netlike waveguide structure comprise openings having a lower refractive index than the netlike waveguide structure.

12. The device according to claim 8, wherein said netlike waveguide structure is configured to provide far-order field coupling, amplification of an in-phase supermode and higher loss of an out-of-phase supermode as well as all other lateral modes of the netlike waveguide structure.

13. The device according to claim 8, wherein said laser comprises at least one heterostructure having III-IV semiconductor material or II-VI semiconductor material, said heterostructure forming a quantum well, quantum dot or quantum cascade laser.

\* \* \* \* \*